US012154798B2

(12) United States Patent
Mizobe

(10) Patent No.: US 12,154,798 B2
(45) Date of Patent: Nov. 26, 2024

(54) TEMPERATURE MEASUREMENT UNIT, HEAT TREATMENT APPARATUS, AND TEMPERATURE MEASUREMENT METHOD

(71) Applicant: Tokyo Electron Limited, Tokyo (JP)

(72) Inventor: Yutaka Mizobe, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 639 days.

(21) Appl. No.: 17/393,678

(22) Filed: Aug. 4, 2021

(65) Prior Publication Data
US 2022/0051913 A1 Feb. 17, 2022

(30) Foreign Application Priority Data

Aug. 12, 2020 (JP) ................................. 2020-136304

(51) Int. Cl.
*H01L 21/67* (2006.01)
*G01K 1/143* (2021.01)

(52) U.S. Cl.
CPC ........ *H01L 21/67103* (2013.01); *G01K 1/143* (2013.01); *H01L 21/67248* (2013.01)

(58) Field of Classification Search
CPC ........ G01K 1/026; G01K 1/143; G01K 13/00; G01K 2007/422; H01L 21/67103; H01L 21/67109; H01L 21/67178; H01L 21/6719; H01L 21/67248; H01L 21/68742

USPC ............................................ 219/443.1, 444.1
See application file for complete search history.

(56) References Cited

U.S. PATENT DOCUMENTS

| 2006/0052969 A1* | 3/2006 | Hunt ........................ G01K 1/18 374/E1.022 |
| 2008/0144695 A1* | 6/2008 | Hamada ..................... G01K 7/32 374/117 |
| 2018/0308723 A1* | 10/2018 | Otani ................. H01L 21/68742 |
| 2019/0214281 A1* | 7/2019 | Endo .................. H01L 21/67178 |

FOREIGN PATENT DOCUMENTS

JP 2007157896 A 6/2007

* cited by examiner

*Primary Examiner* — Sang Y Paik
(74) *Attorney, Agent, or Firm* — Nath, Goldberg & Meyer; Jerald L. Meyer; Tanya E. Harkins

(57) ABSTRACT

A temperature measurement unit includes a measurement substrate on which a sensor configured to measure a temperature is mounted, an information processor configured to acquire a result of detection by the sensor, and a cable connecting the sensor and the information processor to each other. The information processor is configured to be detachably installed on an installation part facing a heating area provided with a hot plate, with a cooling area interposed therebetween. The cable is configured to be able to follow movement of the measurement substrate when a cooling plate on which the measurement substrate is placed is moved from the cooling area to the heating area and the measurement substrate is placed on the hot plate in a state in which the information processor is installed on the installation part.

11 Claims, 11 Drawing Sheets

TEMPERATURE MEASUREMENT UNIT, HEAT TREATMENT APPARATUS, AND TEMPERATURE MEASUREMENT METHOD

CROSS-REFERENCE TO RELATED APPLICATION

This application is based upon and claims the benefit of priority from Japanese Patent Application No. 2020-136304, filed on Aug. 12, 2020, the entire contents of which are incorporated herein by reference.

TECHNICAL FIELD

The present disclosure relates to a temperature measurement unit, a heat treatment apparatus, and a temperature measurement method.

BACKGROUND

An apparatus disclosed in Patent Document 1 includes: a processing part configured to perform predetermined processing on a substrate; a storage part configured to receive a temperature measurement substrate on which a temperature sensor and a memory part configured to accumulate temperature measurement data measured by the temperature sensor are mounted, and to collect the temperature measurement data accumulated in the memory part of the temperature measurement substrate; transport means configured to transport a substrate between the storage part and the processing part; and a temperature controller configured to control a temperature adjustment mechanism related to predetermined processing such that the temperature state of the predetermined processing becomes a preset temperature state based on the temperature measurement data collected from the temperature measurement substrate transported to the storage part via the processing part.

PRIOR ART DOCUMENT

Patent Document

Patent Document 1: Japanese Laid-Open Patent Publication No. 2007-157896

SUMMARY

According to embodiments of the present disclosure, there is provided a temperature measurement unit including a measurement substrate on which a sensor configured to measure a temperature is mounted, an information processor configured to acquire a result of detection by the sensor, and a cable connecting the sensor and the information processor to each other, wherein the information processor is configured to be detachably installed on an installation part facing a heating area provided with a hot plate, with a cooling area interposed therebetween, and the cable is configured to be able to follow movement of the measurement substrate when a cooling plate on which the measurement substrate is placed is moved from the cooling area to the heating area and the measurement substrate is placed on the hot plate in a state in which the information processor is installed on the installation part.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
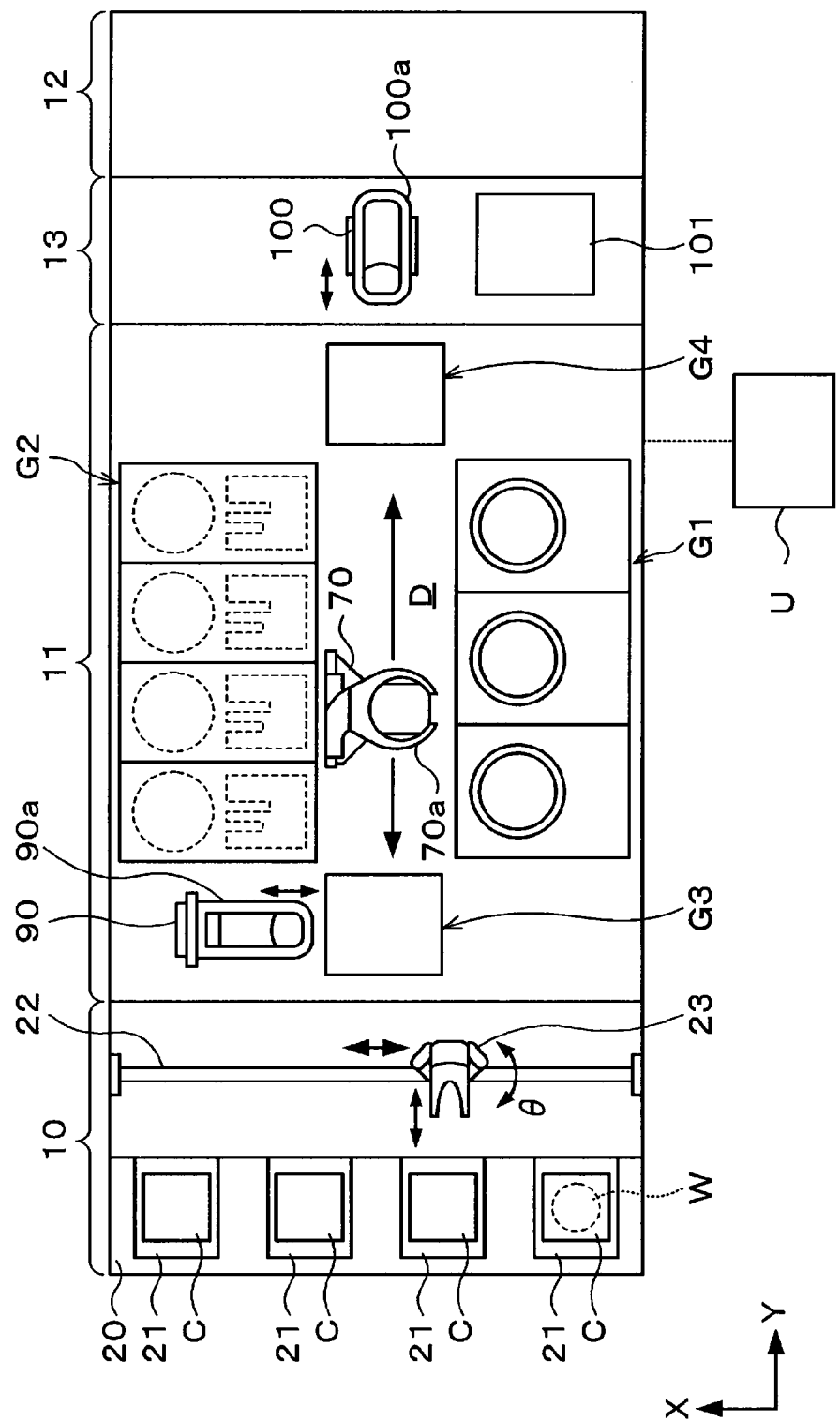
FIG. 1 is an explanatory view illustrating an outline of the internal configuration of a wafer processing system provided with a heat treatment apparatus configured to perform heat treatment on a wafer.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

In a process of manufacturing a semiconductor device or the like, predetermined processing is performed to form a desired resist pattern on a semiconductor wafer (hereinafter, referred to as a "wafer"). The predetermined processing includes, for example, resist application for forming a resist film by supplying a resist liquid onto a wafer, exposure for exposing the resist film, post exposure bake (PEB) for heating the resist film after the exposure so as to promote a chemical reaction in the resist film, development for developing the exposed resist film, and the like.

Heat treatment, such as the above-mentioned PEB, is usually performed in a heat treatment apparatus having a hot plate on which a wafer is placed and heated. The heat treatment by this heat treatment apparatus is performed in order to make, for example, the in-plane temperature of the wafer uniform. This is for making in-plane dimensions of a resist pattern uniform.

As described above, for the purpose of achieving uniform in-plane heating of a wafer or the like through heat treatment of the heat treatment apparatus, conventionally, the temperature of the wafer when heated by the hot plate is measured in a simulated manner in advance, and based on the result, the amount of heating by the hot plate is corrected.

As a technique for measuring the temperature of a wafer when heated using the hot plate in a simulated manner, for example, there is a technique of using a temperature measurement wafer equipped with a plurality of temperature sensors and a memory (see Patent Document 1). In this technique, the temperature measurement wafer is heated using a hot plate in the same manner as a normal wafer, the temperature is measured by each temperature sensor, and the temperature is stored in the memory as temperature measurement data.

The hot plate may be heated to a high temperature of, for example, 250 degrees C. or higher, and the wafer may be heated using the hot plate. In this case, when the temperature measurement wafer disclosed in Patent Document 1 is used, the memory may break down by being exposed to a high-temperature environment. When the memory breaks down, it is impossible to use the temperature measurement data stored in the memory. Thus, it is practically the same as if the temperature could not be measured.

Therefore, the technique according to the present disclosure provides a temperature measurement unit, a substrate processing apparatus, and a temperature measurement method capable of measuring the temperature of a substrate when heated using a high-temperature hot plate in a simulated manner.

Hereinafter, the temperature measurement unit, the heat treatment apparatus, and the temperature measurement method according to the present embodiment will be described with reference to the drawings. In the specification, elements having substantially the same functional configurations will be denoted by the same reference numerals, and redundant descriptions will be omitted.

<Wafer Processing System>

Figure 2:
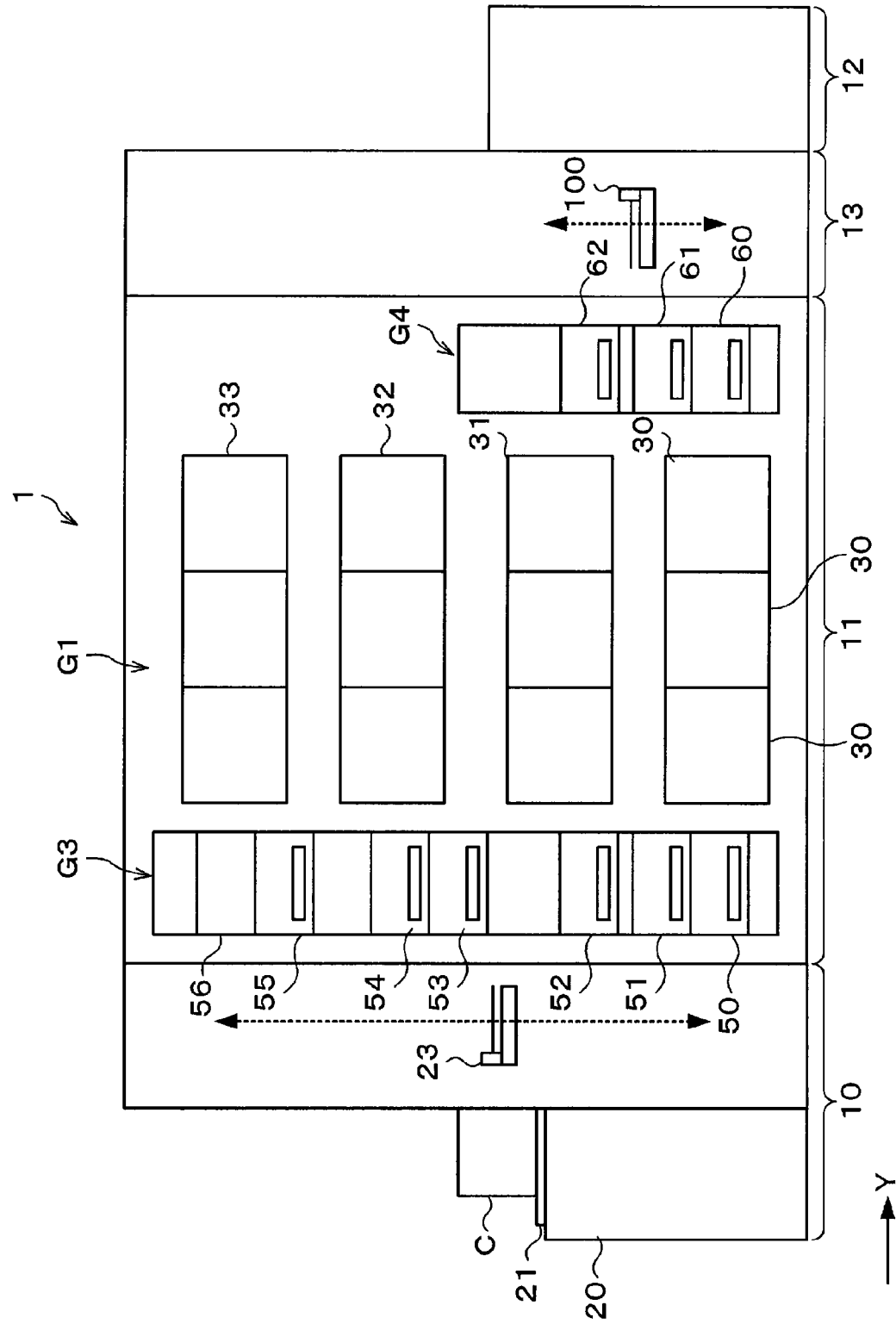
FIG. 2 is a view schematically illustrating an outline of the internal configuration on a front side of the wafer processing system.
Figure 3:
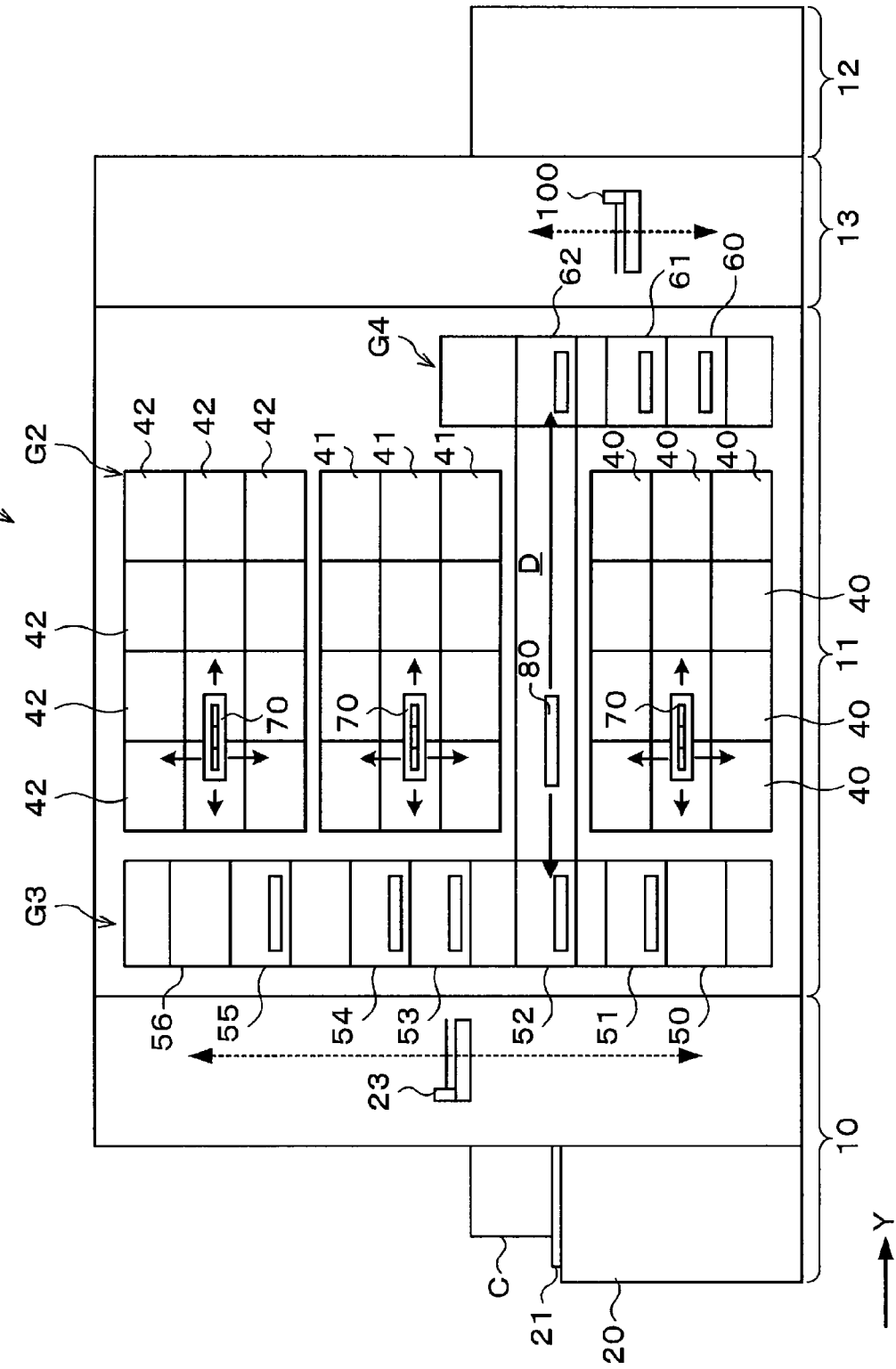
FIG. 3 is a view schematically illustrating an outline of the internal configuration on a rear side of the wafer processing system.

FIG. 1 is an explanatory view illustrating an outline of the internal configuration of a wafer processing system 1 provided with a heat treatment apparatus configured to perform heat treatment on a wafer. FIGS. 2 and 3 are views schematically illustrating outlines of a front side internal configuration and a rear side internal configuration of the wafer processing system 1, respectively. In the following example, the wafer processing system 1 is an application/development system that performs application and development on a wafer W.

As illustrated in FIG. 1, the wafer processing system 1 includes a cassette station 10 in which cassettes C, each accommodating a plurality of wafers W, are carried in or carried out, and a processing station 11 provided with a plurality of various processing apparatuses, each configured to perform predetermined processing on a wafer W. The wafer processing system 1 has a configuration in which the cassette station 10, the processing station 11, and an interface station 13 configured to deliver wafers W to and from an exposure apparatus 12 adjacent to the processing station 11 are integrally connected.

The cassette station 10 is provided with a cassette placement stage 20. The cassette placement stage 20 is provided with a plurality of cassette placement plates 21 on each of which a cassette C is placed when the cassette C is carried in and out of the wafer processing system 1.

The cassette station 10 is provided with a wafer transport apparatus 23 that is movable on a transport path 22 extending in the X direction. The wafer transport apparatus 23 is also movable in the vertical direction and around the vertical axis (in a θ direction), and is capable of transporting a wafer W between the cassette C on each cassette placement plate 21 and a delivery apparatus of a third block G3 of the processing station 11 to be described later.

The processing station 11 is provided with a plurality of (e.g., four) blocks G1, G2, G3, and G4, each equipped with various apparatuses. For example, the first block G1 is provided on the front side of the processing station 11 (on the negative side in the X direction in FIG. 1), and a second block G2 is provided on the rear side of the processing station 11 (on the positive side in the X direction in FIG. 1). In addition, a third block G3 is provided on the cassette station 10 side (the negative side in the Y direction in FIG. 1) of the processing station 11, and a fourth block G4 is provided on the interface station 13 side (the positive side in the Y direction in FIG. 1) of the processing station 11.

As illustrated in FIG. 2, in the first block G1, a plurality of liquid processing apparatuses, such as development apparatuses 30, a lower antireflective film forming apparatuses 31, resist application apparatuses 32, and an upper antireflective film forming apparatuses 33 are disposed in this order from the bottom. Each development apparatus 30 develops a wafer W, and the lower antireflective film forming apparatuses 31 form an antireflective film (hereinafter referred to as a "lower antireflective film") under a resist film of the wafer W. Each of the resist application apparatuses 32 forms a resist film by applying a resist liquid to a wafer W, and each upper antireflective film forming apparatus 33 forms an antireflective film (hereinafter referred to as an "upper antireflective film") on a resist film of the wafer W.

For example, the development apparatuses 30, the lower antireflective film forming apparatuses 31, the resist application apparatuses 32, and the upper antireflective film forming apparatuses 33 are each arranged in threes in the horizontal direction. In addition, the numbers and arrangements of the development apparatuses 30, the lower antireflective film forming apparatuses 31, the resist application apparatuses 32, and the upper antireflective film forming apparatuses 33 may be arbitrarily selected.

In these development apparatuses 30, the lower antireflective film forming apparatuses 31, the resist application apparatuses 32, and the upper antireflective film forming apparatuses 33, predetermined processing liquids are supplied onto wafers W through, for example, a spin coating method. In the spin coating method, for example, a processing liquid is ejected from an ejection nozzle onto a wafer W, and the wafer W is rotated so as to spread the processing liquid on the surface of the wafer W.

As illustrated in FIG. 3, in the second block G2, heat treatment apparatuses 40 configured to perform heat treatment such as heating or cooling of wafers W, adhesion apparatuses 41 configured to enhance fixability between a resist liquid and wafers W, and periphery exposure apparatuses 42 configured to expose the outer peripheries of wafers W are provided. The heat treatment apparatuses 40, the adhesion apparatuses 41, and the periphery exposure apparatuses 42 are provided and arranged in the vertical direction and the horizontal direction, and the numbers and arrangements thereof may be arbitrarily selected.

For example, in the third block G3, a plurality of delivery apparatuses 50, 51, 52, 53, 54, and 55 are provided in order from the bottom. In addition, in the fourth block G4, a plurality of delivery apparatuses 60, 61, and 62 are provided in order from the bottom.

As illustrated in FIG. 1, a wafer transport area D as a substrate transport area is formed in an area surrounded by the first to fourth blocks G1 to G4. A wafer transport apparatus 70 as a substrate transport apparatus is disposed in the wafer transport area D.

The wafer transport apparatus 70 has a transport arm 70a that is movable, for example, in the Y direction, the X direction, the θ direction, and the vertical direction. The wafer transport apparatus 70 is capable of moving within the wafer transport area D so as to transport wafers W to predetermined apparatuses in the first block G1, the second block G2, the third block G3, and the fourth block G4 around the wafer transport area D. For example, as illustrated in FIG. 3, a plurality of wafer transport apparatuses 70 may be vertically arranged so as to transport wafers W to predetermined apparatuses having substantially the same heights in the blocks G1 to G4, respectively.

In addition, in the wafer transport area D, a shuttle transport apparatus 80 configured to linearly transport a wafer W between the third block G3 and the fourth block G4 is provided.

The shuttle transport apparatus 80 is configured to be linearly movable, for example, in the Y direction in FIG. 3. The shuttle transport apparatus 80 moves in the Y direction in a state of supporting a wafer W, and is capable of transporting the wafer W between the delivery apparatus 52 in the third block G3 and the delivery apparatus 62 in the fourth block G4.

As illustrated in FIG. 1, a wafer transport apparatus 90 is provided on the positive side of the third block G3 in the X direction. The wafer transport apparatus 90 has a transport arm 90a that is movable, for example, in the X direction, the θ direction, and the vertical direction. The wafer transport apparatus 90 is capable of moving vertically in a state of supporting a wafer W so as to transport the wafer W to each delivery apparatus in the third block G3.

The interface station 13 is provided with a wafer transport apparatus 100 and a delivery apparatus 101. The wafer transport apparatus 100 has a transport arm 100a that is movable, for example, in the Y direction, the θ direction, and the vertical direction. The wafer transport apparatus 100 is capable of supporting a wafer W, for example, on the transport arm 100a so as to transport the wafer W among each of the delivery apparatuses in the fourth block G4, the delivery apparatus 101, and the exposure apparatus 12.

As illustrated in FIG. 1, the wafer processing system 1 described above is provided with a controller U. The controller U is constituted with, for example, a computer including a CPU, a memory, or the like, and includes a program storage part (not illustrated). The program storage part stores a program for controlling wafer processing in the wafer processing system 1 or a program for automatically adjusting the amount of heating of the hot plate to be described later by a heater to be described later based on a result of measurement of the temperature by a temperature measurement wafer to be described later. The program may be recorded in a non-transitory computer-readable storage medium, and may be installed in the controller U from the storage medium. Some or all of the programs may be implemented by dedicated hardware (a circuit board).

<Heat Treatment Apparatus>

Figure 4:
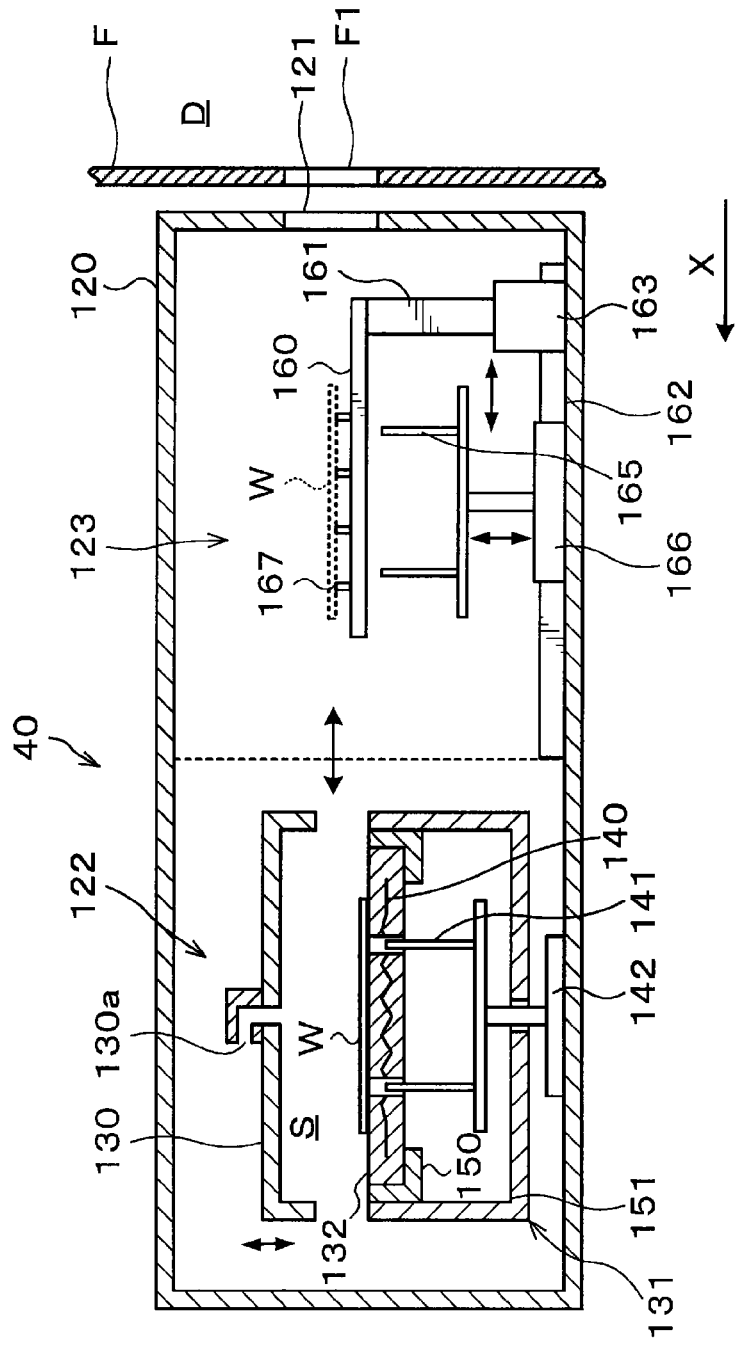
FIG. 4 is a vertical cross-sectional view schematically illustrating an outline of a configuration of the heat treatment apparatus.
Figure 5:
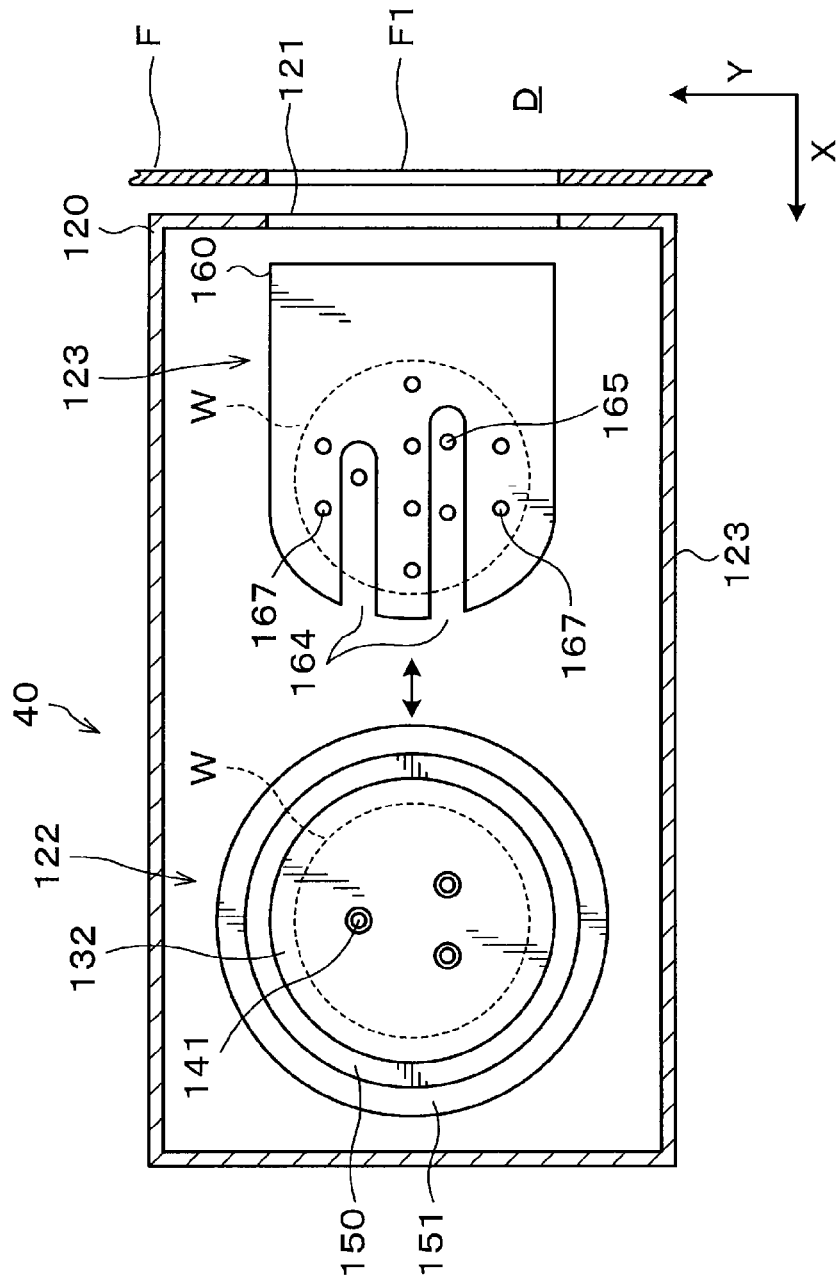
FIG. 5 is a horizontal cross-sectional view schematically illustrating an outline of the configuration of the heat treatment apparatus.

Next, a configuration of the heat treatment apparatus 40 will be described. FIG. 4 is a vertical cross-sectional view schematically illustrating an outline of the configuration of the heat treatment apparatus 40. FIG. 5 is a horizontal cross-sectional view schematically illustrating an outline of the configuration of the heat treatment apparatus 40.

As illustrated in FIGS. 4 and 5, the heat treatment apparatus 40 has a housing 120, the interior of which is capable of being closed. A carry-in/out port 121 of a wafer W is provided on the side surface of the housing 120 on the wafer transport area D side (the negative side in the X direction). The carry-in/out port 121 is provided so as to face an opening F1 formed in a partition wall F as a support member. The partition wall F surrounds the wafer transport area D and supports the heat treatment apparatus 40, the adhesion apparatus 41, and the like. An opening/closing shutter (not illustrated) is provided in the carry-in/out port 121.

Further, the heat treatment apparatus 40 has a heating area 122 for heating a wafer W and a cooling area 123 for cooling a wafer W in the housing 120. The heating area 122 is provided on the side opposite to the wafer transport area D side (the positive side in the X direction), and the cooling area 123 is adjacent to the heating area 122 and is provided on the wafer transport area D side (the negative side in the X direction).

As illustrated in FIG. 4, the heating area 122 is provided, at the upper side, with a vertically movable cover 130, and is provided, at the lower side, with a hot plate accommodation part 131 that forms a processing chamber S together with the cover 130.

The cover 130 has a cylindrical shape with an open lower surface, and covers the top surface of the wafer W placed on a hot plate 132 to be described later. An exhaust portion 130a is provided in the center of the top surface of the cover 130. The atmosphere in the processing chamber S is exhausted from the exhaust portion 130a.

A wafer W is placed in the center of the hot plate accommodation part 131, and the hot plate 132 is provided to heat the wafer W placed thereon. The hot plate 132 has a thick disk shape, and a heater 140 is provided inside the hot plate 132. The heater 140 heats the hot plate 132, specifically, the top surface of the hot plate 132, that is, the wafer W placement surface. As the heater 140, for example, a resistance heating heater is used. In addition, for example, the heater 140 is provided for each area obtained by dividing the top surface of the hot plate 132 into a plurality of areas, and the amount of heating by the heater 140 is adjustable for each area so that the temperature of each area is adjustable to a predetermined set temperature.

The hot plate accommodation part 131 is provided with lift pins 141 that penetrate the hot plate 132 in the thickness direction. The lifting pins 141 are capable of being raised and lowered by a lifting drive part 142 such as a cylinder, and are capable of protruding to the top surface of the hot plate 132 to transport a wafer W to and from a cooling plate 160 to be described later.

As illustrated in FIG. 4, the hot plate accommodation part 131 includes, for example, an annular holding member 150 that accommodates the hot plate 132 and holds the outer peripheral portion of the hot plate 132, and a tubular support ring 151 that surrounds the outer periphery of the holding member 150.

A wafer W is placed in the cooling area 123, and the cooling plate 160 is provided to cool the wafer W placed thereon. The cooling plate 160 has, for example, a flat plate shape having a substantially quadrilateral shape in a plan view, and an end surface on the heating area 122 side (the positive side in the X direction) is curved in an arc shape. Inside the cooling plate 160, for example, a cooling mechanism, such as a coolant flow path through which a coolant, such as cooling water, flows is formed, and the temperature of the cooling plate 160 is adjustable to a predetermined set temperature.

For example, as illustrated in FIG. 4, the cooling plate 160 is supported on a support arm 161, and the support arm 161 is installed on a rail 162 extending toward the heating area 122 side in the X direction. The cooling plate 160 is movable on the rail 162 by a drive mechanism 163 attached to the support arm 161. Thus, the cooling plate 160 is movable to the upper side of the hot plate 132 in the heating area 122 side.

The cooling plate 160 includes, for example, two slits 164 formed in the moving direction of the cooling plate 160 (the X direction in FIG. 5). The slits 164 are formed from the end surface of the cooling plate 160 on the heating area 122 side up to the vicinity of the central portion of the cooling plate 160. The slits 164 prevent interference between the cooling plate 160 that has moved to the heating area 122 side and the lifting pins 141 on the hot plate 132. As illustrated in FIG. 4, lifting pins 165 are provided below the cooling plate 160 in the cooling area 123. The lifting pins 165 are capable of being raised/lowered by the lifting drive part 166. The lifting pins 165 are raised from the lower side of the cooling plate 160, pass through the slits 164, and protrude to the upper side of the cooling plate 160 so as to be capable of delivering a wafer W to and from a wafer transport apparatus 70 entering the inside of the housing 120 from, for example, the carry-in/out port 121.

On the top surface of the cooling plate 160, a plurality of support pins 167 are provided to separate the rear surface of a wafer W from the top surface of the cooling plate 160 and to support the wafer W. The support pins 167 are formed in a rod shape and are provided so as to extend upward. The height of the support pins 167 is, for example, 2 mm.

<Wafer Processing>

Next, wafer processing performed using the wafer processing system 1 will be described.

First, a cassette C containing a plurality of wafers W is placed on a predetermined cassette placement plate 21 of the cassette station 10. Thereafter, respective wafers W in the cassette C are sequentially taken out by the wafer transport apparatus 23 and transported to, for example, the delivery apparatus 52 of the third block G3 of the processing station 11.

Thereafter, the wafers W are transported by the wafer transport apparatus 70 to, for example, the lower antireflective film forming apparatuses 31 of the first block G1, and a lower antireflective film is formed on each of the wafers W. Thereafter, the wafers W are transported to the heat treatment apparatuses 40 of the second block G2 by the wafer transport apparatus 70, and heat treatment is performed.

Each of the wafers W transported to respective heat treatment apparatuses 40 are first placed on the cooling plate 160. Subsequently, the cooling plate 160 is moved to the upper side of the hot plate 132. Next, the lifting pins 141 are raised, and the wafer W on the cooling plate 160 is delivered to the lifting pins 141. Thereafter, the cooling plate 160 retracts from the upper side of the hot plate 132, the lifting pins 141 are lowered, and the wafer W is delivered onto the hot plate 132. In addition, the cover 130 is lowered to form the processing chamber S, and the heat treatment of the wafer W is started.

When the wafer W is heated for a predetermined time, the cover 130 is raised and the lifting pins 141 are raised to move the wafer W to the upper side of the hot plate 132. In addition, the cooling plate 160 moves onto the hot plate 132. Then, the lifting pins 141 are lowered, and the wafer W is delivered to the cooling plate 160. Thereafter, the cooling plate 160 moves to the cooling area 123. The wafer W delivered to the cooling plate 160 is cooled to room temperature in, for example, the cooling area 123 and carried out from the heat treatment apparatus 40.

The wafer W on which heat treatment has been completed in the heat treatment apparatus 40 is transported to the resist application apparatus 32 by the wafer transport apparatus 70, and a resist film is formed on the wafer W. Thereafter, the wafer W is transported by the wafer transport apparatus 70 to the heat treatment apparatus 40, and is prebaked. In the pre-baking, the same treatment as the heat treatment after the formation of the lower antireflective film is performed, and the same treatment is also performed in the heat treatment after the formation of the antireflective film, the PEB, and the post-baking, which will be described later. However, the heat treatment apparatuses 40 provided for respective heat treatments are different from each other.

Next, the wafer W is transported to an upper antireflective film forming apparatus 33 by the wafer transport apparatus 70, and an upper antireflective film is formed on the wafer W. Thereafter, the wafer W is transported to the heat treatment apparatus 40 and subjected to heating. Thereafter, the wafer W is transported to a periphery exposure apparatus 42 by the wafer transport apparatus 70 and subjected to periphery exposure.

Next, the wafer W is transported to a delivery apparatus 52 by the wafer transport apparatus 70, and is transported to the delivery apparatus 62 of the fourth block G4 by the shuttle transport apparatus 80. Thereafter, the wafer W is transported to the exposure apparatus 12 by the wafer transport apparatus 100 of the interface station 13 and exposed in a predetermined pattern. Next, the wafer W is transported to the delivery apparatus 60 of the fourth block G4 by the wafer transport apparatus 100. Thereafter, the wafer W is transported to a heat treatment apparatus 40 by the wafer transport apparatus 70 and subjected to PEB.

Next, the wafer W is transported to the development apparatus 30 by the wafer transport apparatus 70 and subjected to development. After the development, the wafer W is transported to a heat treatment apparatus 40 by the wafer transport apparatus 70 and post-baked.

Next, the wafer W is transported by the wafer transport apparatus 70 to the delivery apparatus 50 of the third block G3. Thereafter, the wafer W is transported to the cassette C of the predetermined cassette placement plate 21 by the wafer transport apparatus 23 of the cassette station 10, and a series of photolithography steps is completed. Then, this series of photolithography steps is also carried out for subsequent wafers W in the same cassette C.

<Temperature Measurement Unit>

Figure 6:
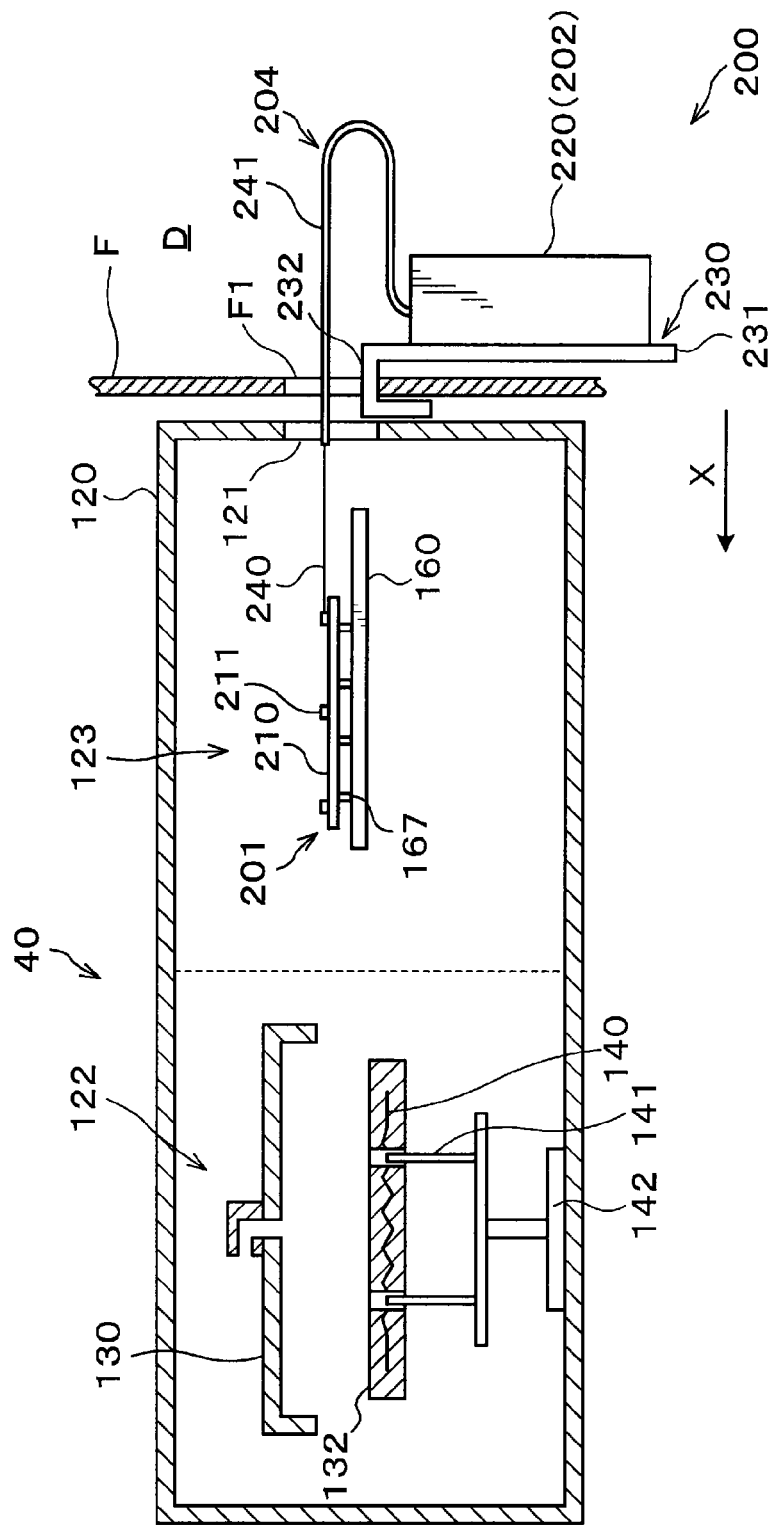
FIG. 6 is a side view illustrating an outline of an exemplary temperature measurement unit.
Figure 7:
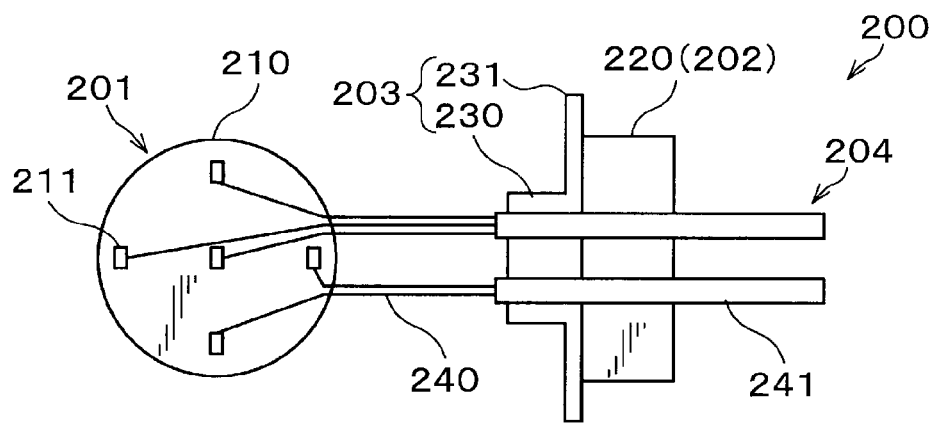
FIG. 7 is a plan view illustrating an outline of an exemplary temperature measurement unit.

Next, an exemplary temperature measurement unit configured to measure the temperature on the hot plate 132 of a heat treatment apparatus 40 in a simulated manner will be described. FIG. 6 is a side view illustrating an outline of an exemplary temperature measurement unit which is shown in a state of being installed in a heat treatment apparatus 40, and for the heat treatment apparatus 40, illustrates only main parts related to temperature measurement in a vertical cross section. FIG. 7 is a plan view illustrating an outline of the exemplary temperature measurement unit.

As illustrated in FIGS. 6 and 7, the temperature measurement unit 200 includes a measurement wafer 201 as a measurement substrate, an information processor 202, a mounting member 203, and a cable 204.

The measurement wafer 201 has a body 210 formed of the same material as a wafer W and formed in the same shape as the wafer W. A plurality of temperature sensors 211 are mounted on the top surface of the measurement wafer 201 (specifically, the top surface of the body 210). In the example of FIG. 7, five temperature sensors 211 are mounted with one temperature sensor being mounted in the center of the measurement wafer 201 and the other four being mounted on the same circumference centered on the center of the measurement wafer 201 at regular intervals. For example, thermocouples may be used for the temperature sensors 211. The number of mounted temperature sensors 211 may be one.

The measurement wafer 201 is placed on the cooling plate 160 located in the cooling area 123, is transported to the heating area 122 by the cooling plate 160, and is transported from the cooling plate 160 to the hot plate 132 and placed on the hot plate 132 in the same manner as a normal wafer W.

The information processor 202 acquires at least a result of detection by the temperature sensors 211. The information processor 202 has a housing 220 having a rectangular parallelepiped outer shape. Although not illustrated, inside the housing 220, for example, an A/D converter that A/D-converts the result of detection by the temperature sensors 211, a processor that calibrates the A/D-converted result of detection, a memory that stores the result of detection by the temperature sensors 211 after the calibration and a calibration value table used for the calibration, and a communication unit that communicates with the controller U and transmits the result of detection and the like are provided. The communication by the communication unit with the controller U may be performed in a wired or wireless manner. Further, inside the housing 220, a wiring board (not illustrated) or the like on which the above-mentioned A/D converter, processor, memory, and communication unit are mounted is also provided.

The mounting member 203 is a member for detachably installing the information processor 202 on the partition wall F serving as an installation part facing the heating area 122 with the cooling area 123 interposed therebetween. The mounting member 203 has a hook portion 230 and a fixing portion 231.

The hook portion 230 is engaged with a lower edge of the partition wall F. The hook portion 230 is provided so as to extend from an upper end of the fixing portion 231 toward the heat treatment apparatus 40 side. The fixing portion 231 is formed in a flat plate shape extending along the partition wall F, and the information processor 202 is fixed to the surface opposite to the partition wall F.

The information processor 202 is installed on the partition wall F via the mounting member 203 by the engagement between the hook portion 230 and the lower edge of the opening F1 in the partition wall F. In addition, it is possible to separate the information processor 202 from the partition wall F by releasing the engagement between the hook portion 230 and the lower edge of the opening F1 in the partition wall F.

The cable 204 electrically connects the temperature sensors 211 of the measurement wafer 201 and the information processor 202 to each other, and transmits the result of detection by the temperature sensors 211 to the information processor 202. The cable 204 has a plurality of coated wires 240 and a flat cable 241.

The coated wires 240 are obtained by coating wires made of a metal material, such as nickel, with a material having insulating and heat-resistant properties (e.g., ceramic). One end of each of the coated wires 240 is connected to the corresponding temperature sensor 211, and the other end is connected to one end of the flat cable 241. The portions of the coated wires 240 located above the measurement wafer 201 are fixed to the top surface of the body 210 of the measurement wafer 201 with, for example, a heat-resistant adhesive.

The flat cable 241 is formed of, for example, a flexible printed circuit (FPC) board based on polyimide, and has a plurality of wiring patterns (not illustrated) therein. One end of the flat cable 241 is connected to the other ends of the coated wires 240, and the other end of the flat cable 241 is connected to the information processor 202. Specifically, one end of each of the wiring patterns of the flat cable 241 is connected to the other end of the corresponding coated wire 240, and the other end of each of the wiring patterns is connected to the information processor 202.

The cable 204 is configured to be able to follow the movement of the measurement wafer 201 when the measurement wafer 201 is moved with the information processor 202 installed on the partition wall F. Specifically, the cable 204 is configured to be able to follow the movement of the measurement wafer 201 when the measurement wafer 201 is placed on the hot plate 132 after the cooling plate 160 on which the measurement wafer 201 is placed is moved from the cooling area 123 to the heating area 122 in a state in which the information processor 202 is installed on the partition wall F. More specifically, the cable 204 has a length and flexibility capable of following the movement of the measurement wafer 201 in a state in which the information processor 202 is installed on the partition wall F.

Further, at least a portion of the cable 204 located in the heating area 122 in a state in which the measurement wafer 201 is placed on the hot plate 132 includes the coated wires 240.

<Temperature Measurement Method>

Figure 8:
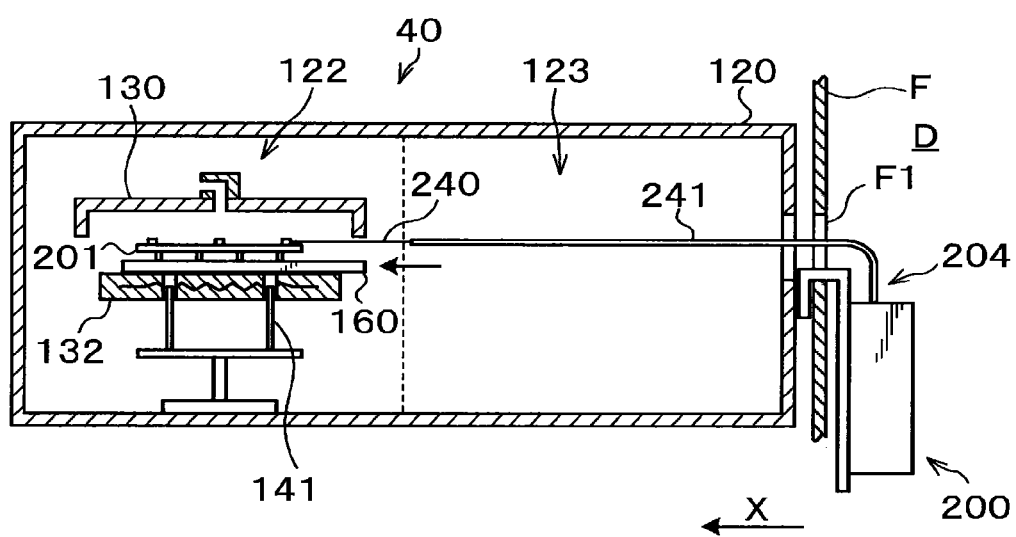
FIG. 8 is a view illustrating a state of a temperature measurement unit in some steps of a temperature measurement method.
Figure 9:
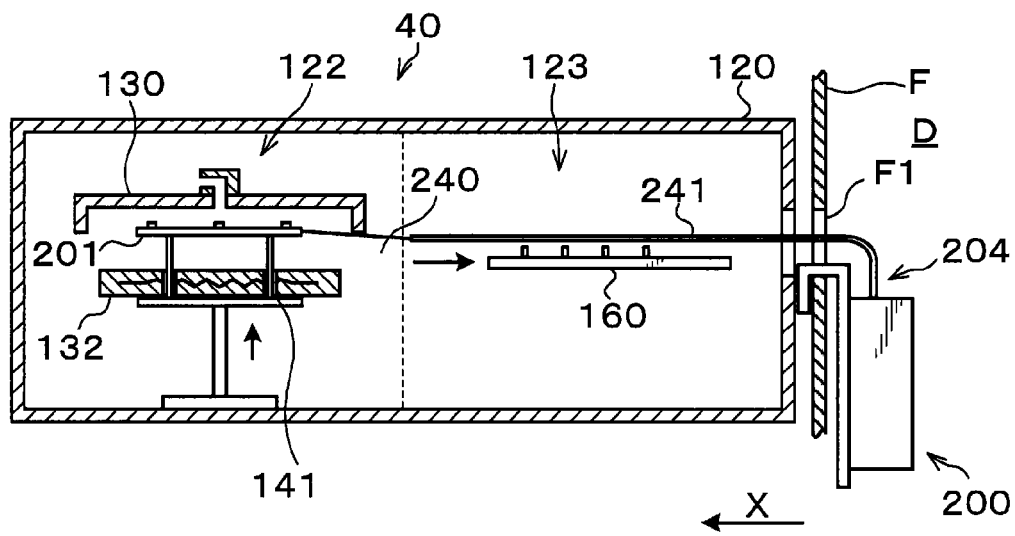
FIG. 9 is a view illustrating a state of the temperature measurement unit in some steps of the temperature measurement method.
Figure 10:
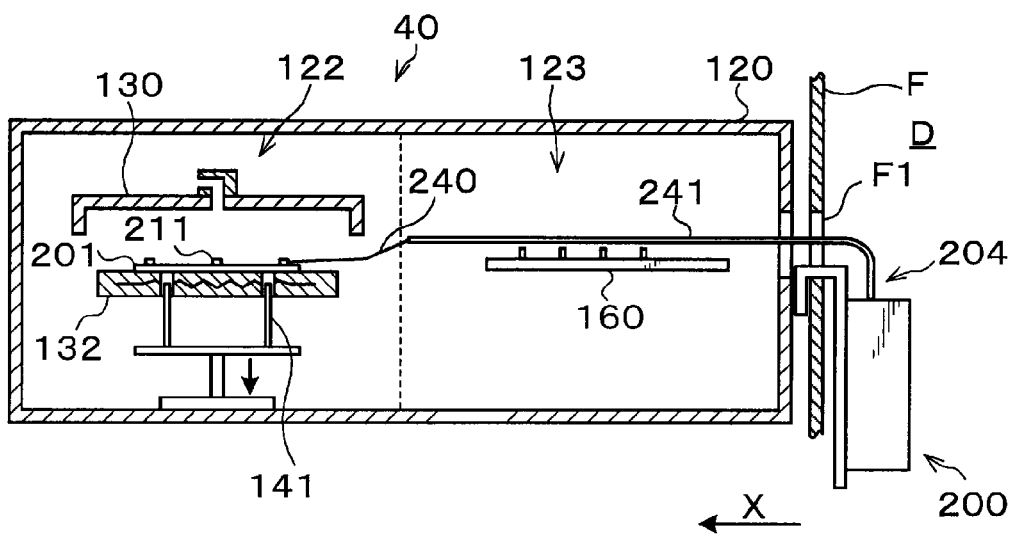
FIG. 10 is a view illustrating a state of the temperature measurement unit in some steps of the temperature measurement method.

Next, a temperature measurement method using the above-mentioned temperature measurement unit 200 will be described with reference to FIGS. 8 to 10. FIGS. 8 to 10 are views illustrating a state of the temperature measurement unit 200 in some steps of the temperature measurement method.

(1. Securing of Moving Line)

First, the moving line of an operator is secured according to the position of the heat treatment apparatus 40 in which the temperature is measured (hereinafter referred to as a "target heat treatment apparatus 40"). For example, when the target heat treatment apparatus 40 is located on the cassette station 10 side, some or all of the delivery apparatuses 50 to 55 of the third block G3 are separated by the operator, and the transport arm 70a of a wafer transport apparatus 70 is moved to the interface station 13 side by the controller U. As a result, the operator is able to enter the wafer transport area D from the cassette station 10 and to move to the front side of the target heat treatment apparatus 40. When the target heat treatment apparatus 40 is located on the interface station 13 side, some or all of the delivery apparatuses 60 to 62 of the fourth block G4 are separated by the operator, and the transport arm 70a of the wafer transport apparatus 70 is moved to the cassette station 10 side by the controller U. As a result, the operator is able to enter the wafer transport area D from the interface station 13 and to move to the front side of the target heat treatment apparatus 40.

(2. Heating of Hot Plate)

Heating of the hot plate 132 is started during or before securing the moving line. Then, the hot plate 132 is heated to a high set temperature of 250 degrees C. or higher to be in a state in which the hot plate 132 is capable of heating the wafer W. The heating of the hot plate 132 may be started after securing the moving line.

(3. Installation of Information Processor 202)

Then, the information processor 202 of the temperature measurement unit 200 is installed on a partition wall F by an operator who has entered the wafer transport area D. Specifically, the operator who has entered the wafer transport area D hooks the hook portion 230 of the mounting member 203 on the lower edge of the opening F1 in the partition wall F corresponding to the target heat treatment apparatus 40. The information processor 202 is installed on the partition wall F via the mounting member 203 through the engagement between the hook portion 230 and the lower edge of the opening F1 in the partition wall F. The information processor 202 is installed so as to be located in the wafer transport area D.

(4. Placement of Measurement Wafer 201)

Next, the operator places the measurement wafer 201 on the cooling plate 160 located in the cooling area 123. Specifically, the operator places the measurement wafer 201 at a predetermined position on the cooling plate 160 located in the cooling area 123 via the support pins 167 in a predetermined orientation. The information processor 202 may be installed after the measurement wafer 201 is placed on the cooling plate 160. After the information processor 202 is installed and the measurement wafer 201 is placed, the operator leaves the wafer processing system 1.

(5. Delivery to Hot Plate 132)

Next, the measurement wafer 201 is moved, that is, transported to the heating area 122 by the cooling plate 160, and is delivered to the hot plate 132. Specifically, first, the cooling plate 160 on which the measurement wafer 201 is placed is moved from the cooling area 123 to the heating area 122, as illustrated in FIG. 8. This movement is performed until the cooling plate 160 moves above the hot plate 132. Next, as illustrated in FIG. 9, the lifting pins 141 are raised, whereby the measurement wafer 201 on the cooling plate 160 is delivered to the lifting pins 141 and is raised, and then the cooling plate 160 is retracted from the heating area 122 to the cooling area 123. At the same time, as illustrated in FIG. 10, the lifting pins 141 are lowered, and the measurement wafer 201 is placed on the hot plate 132.

(6. Temperature Detection)

Then, the temperature is detected by the temperature sensors 211. Specifically, first, the cover 130 is lowered to form the processing chamber S, and the heating of the wafer W is started. When a predetermined time has elapsed from the start of the heating and the temperature of the measurement wafer 201 becomes stable, the temperature detection by the temperature sensors 211 is started. When the temperature detection is started, each temperature sensor 211 detects the temperature of the portion of the measurement wafer 201 (the body 210) on which the temperature sensor 211 is mounted. The detection result is transmitted, via the cable 204, to the information processor 202 installed on the partition wall F facing the heating area 122 with the cooling area 123 interposed therebetween. In addition, the detection result is transmitted from the information processor 202 to the controller U. The controller U calculates, that is, measures the temperature of the portion of the measurement wafer 201 on which the temperature sensors 211 are mounted from the above detection result. Further, the controller U automatically adjusts the amount of heating of the hot plate 132 by the heater 140 based on the result of the measurement of the temperature by the measurement wafer 201. After this adjustment, temperature detection and temperature measurement are performed again in the same manner as described above, and automatic adjustment of the amount of heating the hot plate 132 by the heater 140, temperature detection, and temperature measurement are performed until a desired temperature measurement result is obtained. When the desired temperature measurement result is obtained, the temperature detection is terminated.

(7. Delivery to Cooling Plate 160 Located in Heating Area 122)

When the temperature detection is terminated, the measurement wafer 201 is returned to the cooling plate 160. Specifically, the cooling plate 160 is relocated to the heating area 122, and the measurement wafer 201 is placed on the cooling plate 160 located in the heating area 122. More specifically, first, the lifting pins 141 are raised, and the measurement wafer 201 on the hot plate 132 is delivered to the lifting pins 141 and raised. Thereafter, the cooling plate 160 is moved to the heating area 122 and inserted into the space between the measurement wafer 201 and the hot plate 132. Then, the lifting pins 141 are lowered, and the measurement wafer 201 is placed on the cooling plate 160.

(8. Cooling of Measurement Wafer 201)

Next, the measurement wafer 201 is cooled by the cooling plate 160. Specifically, the cooling plate 160 on which the measurement wafer 201 is placed is moved to the cooling area 123, and the measurement wafer 201 is cooled by the cooling plate 160 in the cooling area 123. The measurement wafer 201 is cooled to, for example, room temperature.

(9. Separation)

After cooling, the measurement wafer 201 is removed from the cooling plate 160 by the operator who has entered the wafer transport area D, and the information processor 202 is separated from the partition wall F together with the mounting member 203.

Respective steps described above are sequentially performed for each heat treatment apparatus 40. A plurality of temperature measurement units 200 may be prepared, and multiple temperature measurements of the heat treatment apparatuses 40 may be performed in parallel.

In the temperature measurement method according to the present embodiment, the temperature measurement unit 200 is used as described above. The temperature measurement unit 200 has a cable 204 that connects the temperature sensor 211 mounted on the measurement wafer 201 and the information processor 202 that acquires the result of detection by the temperature sensor 211. In addition, the cable 204 is configured to be able to follow the movement of the measurement wafer 201 when the measurement wafer 201 is placed on the hot plate 132 after the cooling plate 160 on which the measurement wafer 201 is placed is moved from the cooling area 123 to the heating area 122 in a state in which the information processor 202 is detachably installed on the partition wall F. By using such a temperature measurement unit 200, the information processor 202 is installed on the partition wall F, and based on the result of detection by the temperature sensors 211 mounted on the measurement wafer 201, it is possible to measure the temperature of the measurement wafer 201 heated by the hot plate 132. The information processor 202 includes parts that may break down or may be damaged in a high-temperature environment (e.g., an A/D converter, a processor, a memory, a communication unit, and a wiring board in the housing 220 described above). However, since the partition wall F on which the information processor 202 is installed faces the heating area 122 with the cooling area 123 interposed therebetween to be separated from the heating area 122, the above-mentioned parts do not break down or are not damaged even when the hot plate 132 has a high temperature. Therefore, even when the hot plate 132 has a high temperature, it is possible to measure the temperature of the measurement wafer 201 heated on the hot plate 132. Therefore, regardless of whether the hot plate 132 has a high temperature or a low temperature, it is possible to measure the temperature of the wafer W when heated by the hot plate 132 in a simulated manner.

As a temperature measurement method other than the temperature measurement method according to the present disclosure, it is possible to consider a method in which an operator opens a panel on the rear side of the wafer processing system 1 and directly places a measurement wafer similar to the measurement wafer 201 on the hot plate 132, thereby performing temperature measurement, and then the operator directly removes the measurement wafer from the hot plate 132 (hereinafter, referred to as an "alternative method"). In this alternative method, if the hot plate 132 is heated to a set temperature when the measurement wafer is placed on the hot plate 132, it is impossible for the operator to work safely. Therefore, for example, during the placement of the measurement wafer onto the hot plate 132, the hot plate 132 is set to room temperature, and after the placement, the temperature of the hot plate 132 is raised from the room temperature to the set temperature. Since a long time is needed for raising the temperature, it is not possible to safely measure the temperature in a short time using the alternative method described above.

In contrast, in the temperature measurement method according to the present embodiment, the operator places the measurement wafer 201 on the cooling plate 160 located in the cooling area 123, and the measurement wafer 201 is placed on the hot plate 132 via the cooling plate 160. Therefore, it is possible to heat the hot plate 132 to a set temperature even before the measurement wafer 201 is placed on the hot plate 132. Therefore, according to the present embodiment, it is not necessary to raise the temperature of the hot plate 132 after the measurement wafer 201 is placed, which is necessary in the above alternative method. Thus, it is possible to safely measure the temperature in a short time.

In the above alternative method, when the hot plate 132 and the measurement wafer has been heated to the set temperature at the time of removing the measurement wafer, it is impossible for the operator to work safely. Therefore, for example, after the temperature is measured, the temperature of the hot plate 132 and the measurement wafer is lowered to room temperature, and then the measurement wafer is removed from the hot plate 132. Since this temperature decrease takes a long time, even from this viewpoint, it is not possible to safely measure the temperature in a short time using the alternative method described above.

In contrast, in the temperature measurement method according to the present embodiment, after the measurement wafer 201 is cooled by the cooling plate 160, the measurement wafer 201 is removed from the cooling plate 160 located in the cooling area 123 by the operator. Therefore, it is not necessary to lower the temperature of the hot plate 132 after the temperature measurement, which is necessary in the above alternative method. Thus, it is also possible to lower the temperature of the measurement wafer 201 to room temperature, that is, to cool the measurement wafer 201 in a short time. Therefore, according to the present embodiment, it is possible to safely measure the temperature in a short time.

In the above alternative method, the operator performs the work at the rear back side of the wafer processing system 1. In many cases, since there is not enough space on the rear side of the wafer processing system 1, work at the rear side of the wafer processing system 1 has poor workability and it is difficult for the operator to move to the vicinity of the target heat treatment apparatus 40. In contrast, in the temperature measurement method according to the present embodiment, the operator performs work in the wafer transport area D of the wafer processing system 1. Since a sufficient space is secured in the wafer transport area D, the work in the wafer transport area D has better workability than the work at the rear side, and makes it easy for the operator to move to the vicinity of the target heat treatment apparatus 40.

In addition, according to the present embodiment, it is possible to shorten the time required for temperature measurement by 50 hours or more compared with the alternative method described above. Furthermore, according to the present embodiment, since it is possible to perform temperature measurement in a short time, it is also possible to shorten the time required for automatically adjusting the amount of heating the hot plate 132 in the heat treatment apparatus 40, including the time required for the temperature measurement.

<Another Exemplary Temperature Measurement Unit>

Figure 11:
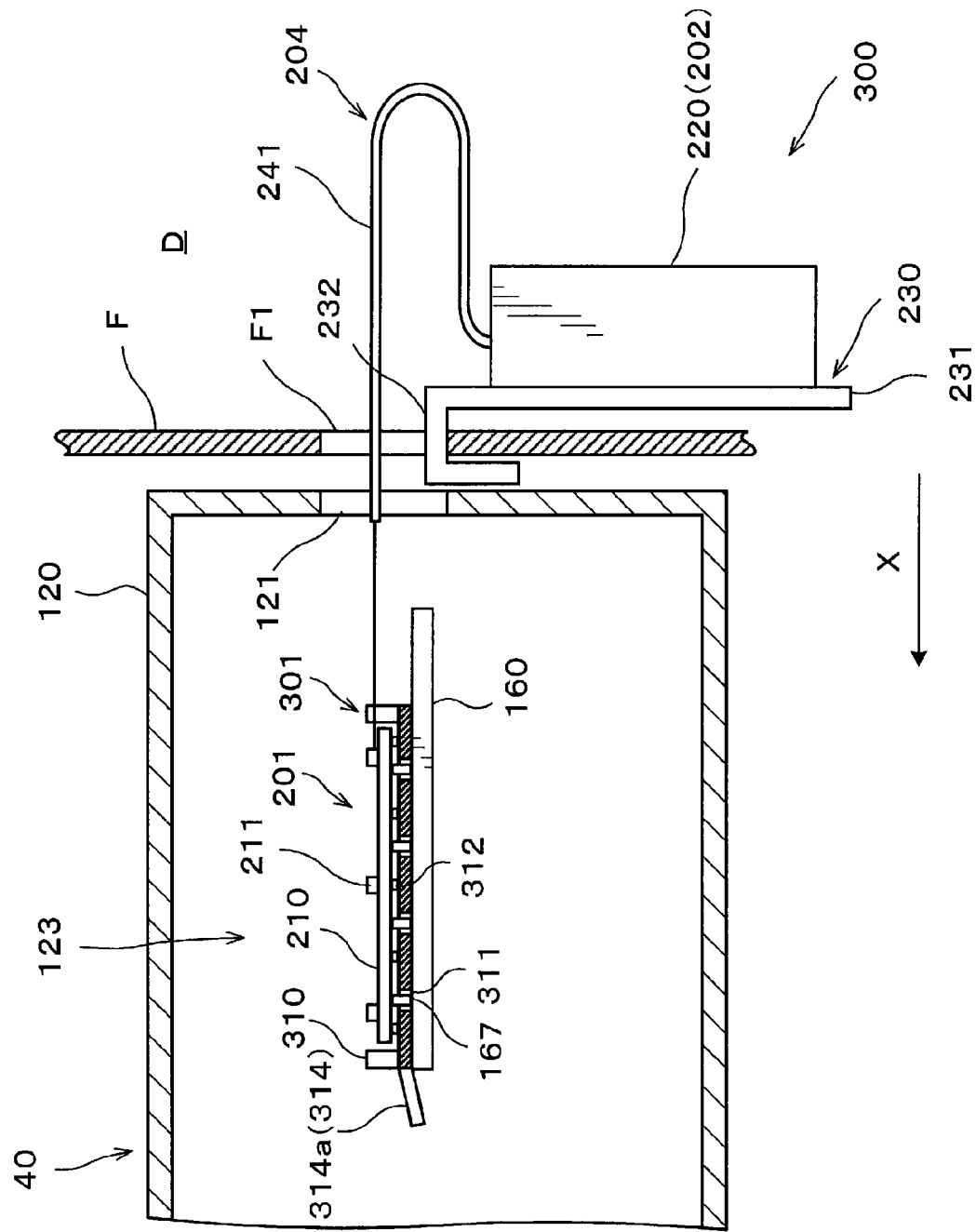
FIG. 11 is a side view illustrating an outline of another exemplary temperature measurement unit.
Figure 12:
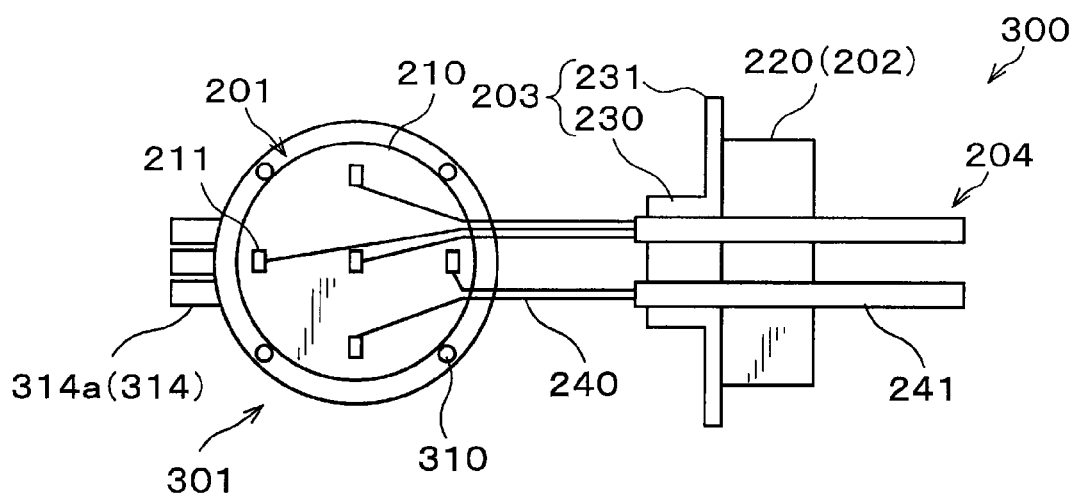
FIG. 12 is a plan view illustrating an outline of the another exemplary temperature measurement unit.

Subsequently, another exemplary temperature measurement unit will be described. FIG. 11 is a side view illustrating an outline of another exemplary temperature measurement unit, which is shown in a state of being installed in a heat treatment apparatus 40, and for the heat treatment apparatus 40, partially illustrates only main parts related to temperature measurement in a vertical cross section. In FIG. 11, only a part of the guide plate 301, which will be described later, is illustrated in a cross section. FIG. 12 is a plan view illustrating an outline of the another exemplary temperature measurement unit. FIGS. 13 to 16 are views for describing the effect of the temperature measurement units in the example of FIGS. 11 and 12.

The temperature measurement unit 300 of FIG. 11 has a guide plate 301 as an intervening member in addition to the measurement wafer 201, the information processor 202, the mounting member 203, and the cable 204.

The guide plate 301 is positioned with respect to the cooling plate 160 and placed on the cooling plate 160. The measurement wafer 201 is placed on the cooling plate 160 via the guide plate 301. In other words, the measurement wafer 201 is placed on the cooling plate 160 with the guide plate 301 sandwiched between the measurement wafer 201 and the cooling plate 160. In addition, the measurement wafer 201 is cooled by the cooling plate 160 via the guide plate 301. Specifically, the measurement wafer 201 is cooled by the guide plate 301 cooled by the cooling plate 160.

Positioning of the guide plate 301 with respect to the cooling plate 160 is performed by fitting a notch (not illustrated) formed in the cooling plate 160 to a positioning protrusion (not illustrated) formed on the bottom surface of the guide plate 301 and protruding downward. A plurality of combinations of the notch and the positioning protrusion may be provided. In addition, the guide plate 301 is formed using a material having high thermal conductivity (e.g., a metal material such as stainless steel).

As illustrated in FIGS. 11 and 12, the guide plate 301 has a plurality of guide pins 310 as guides for positioning the measurement wafer 201 with respect to the guide plate 301. Therefore, when the measurement wafer 201 is placed on the cooling plate 160 via the guide plate 301, the measurement wafer 201 is positioned with respect to the cooling plate 160. Therefore, when the measurement wafer 201 is transported to the upper side of the hot plate 132 by the cooling plate 160, it is possible to transport the measurement wafer 201 to a desired position. As a result, it is possible to reliably place the measurement wafer 201 at a desired position on the hot plate 132. That is, it is possible to position the measurement wafer 201 with respect to the hot plate 132 and to place the measurement wafer 201 on the hot plate 132. More specifically, when the measurement wafer 201 is placed on the hot plate 132, it is possible to suppress the amount of deviation in the horizontal direction from a desired position within a predetermined range.

The hot plate 132 may be provided with a guide protrusion (not illustrated) that guides the wafer W to a desired position on the hot plate 132. By providing the guide pins 310 on the guide plate 301, it is possible to prevent the measurement wafer 201 from riding on the guide protrusion when the measurement wafer 201 is placed on the hot plate 132.

In addition, as illustrated in FIG. 11, the guide plate 301 includes a plurality of through holes 311 formed through the guide plate 301 in the thickness direction. A support pin 167 is inserted through each through hole 311. When the guide plate 301 is placed on the cooling plate 160, the top portions of the support pins 167 protrude from the top surface of the guide plate 301 through the through holes 311. The measurement wafer 201 is supported by the plurality of support pins 167, in which the top portions protrude as described above.

The guide plate 301 may be positioned with respect to the cooling plate 160 through the engagement between the through holes 311 and the support pins 167.

Figure 13:
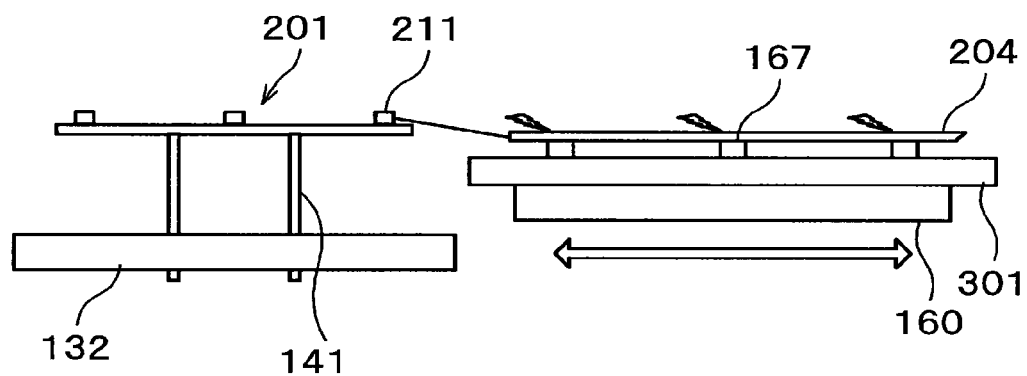
FIG. 13 is a view for describing an effect of the temperature measurement unit in the example of FIGS. 11 and 12.
Figure 14:
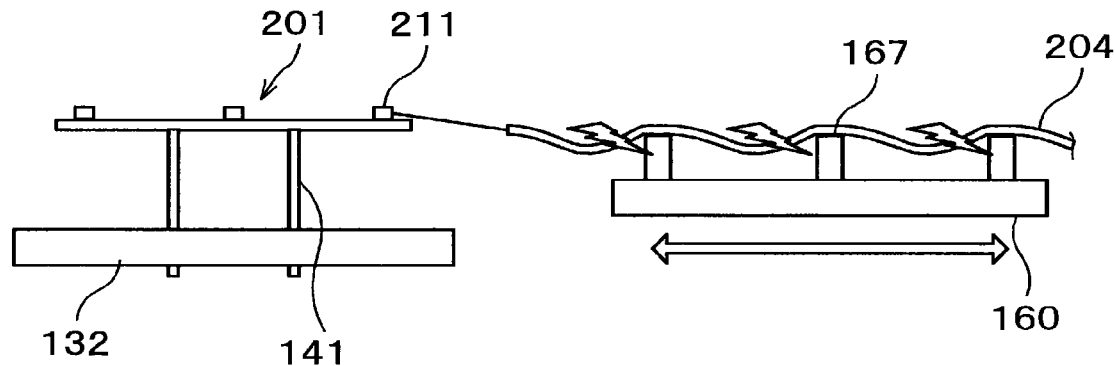
FIG. 14 is a view for describing the effect of the temperature measurement units in the example of FIGS. 11 and 12.

By using the guide plate 301 having the through holes 311, it is possible to reduce the slack amount of the cable 204 from the top portions of the support pins 167 while preventing the cooling efficiency of the measurement wafer 201 from being lowered by the cooling plate 160, as illustrated in FIG. 13. As illustrated in FIG. 14, when the guide plate 301 is not provided and the slack amount is large, the portion of the cable 204 that hangs from the top portions of the support pins 167 may not be movable upward from the top portions of the support pins 167 when the cooling plate 160 is moved. As a result, a large force may act on the cable 204 from the support pins 167, and the cable 204 may be damaged. On the other hand, if the guide plate 301 is used and the slack amount is small as described above, when the cooling plate 160 is moved, the portion of the cable 204 that hangs from the top portions of the support pins 167 moves upward. Thus, no large force acts on the cable 204 from the support pins 167, and thus the cable 204 is not damaged.

Further, if the slack amount is large, when the cooling plate 160 is moved to be separated from the hot plate 132 in a state in which the measurement wafer 201 is supported by the lifting pins 141, the cable 204 also moves following the movement of the cooling plate 160. Thus, the measurement wafer 201 may move on the lifting pins 141. If the measurement wafer 201 moves in this way, it may not be possible to place the measurement wafer 201 at a desired position on the hot plate 132. On the other hand, if the slack amount is small, when the cooling plate 160 is similarly moved in a state in which the measurement wafer 201 is supported by the lifting pins 141, the cable 204 does not move following the movement of the cooling plate 160. Thus, the measurement wafer 201 does not move on the lifting pins 141.

In addition, since the guide plate 301 is thin enough such that the support pins 167 penetrate the guide plate 301, the guide plate 301 has a low heat capacity. Therefore, it is possible to efficiently cool the measurement wafer 201 by the cooling plate 160 via the guide plate 301.

From the viewpoint of heat capacity, the guide plate 301 is preferably thinner than the cooling plate 160. Specifically, the plate-shaped portion of the guide plate 301 is preferably thinner than the plate-shaped portion of the cooling plate 160. This makes it possible to reduce the heat capacity of the guide plate 301. As a result, it is possible to efficiently cool the measurement wafer 201 by the cooling plate 160 via the guide plate 301.

As illustrated in FIG. 11, a plurality of convex portions 312 protruding upward may be formed on the top surface of the guide plate 301, and the measurement wafer 201 may be supported by the plurality of convex portions 312. In this way, when the measurement wafer 201 is supported by the plurality of convex portions 312, or when the measurement wafer 201 is supported by the plurality of support pins 167 protruding from the top surface of the guide plate 301 through the through holes 311, it is possible to reduce a contact area between the guide plate 301 and the measurement wafer 201. Therefore, it is possible to prevent the measurement wafer 201 heated by the hot plate 132 from being damaged by being rapidly cooled by the guide plate 301.

The height of the convex portions 312 is set such that the slack amount of the cable 204 from the top portions of the convex portions 312 is smaller than the slack amount of the cable 204 from the top portions of the support pins 167 when the guide plate 301 is not used. For example, the height of the convex portions 312 is set such that the top portions of the convex portions 312 are substantially the same height as the top portions of the support pins 167.

In addition, as illustrated in FIGS. 11 and 12, a turner (cable supporter) 314 as a rolling prevention portion may be provided at an end of the guide plate 301 on the heating area 122 side. The turner 314 has a slope 314a that is continuous from the top surface of the guide plate 301 and extends obliquely downward from one end of the guide plate 301.

Figure 15:
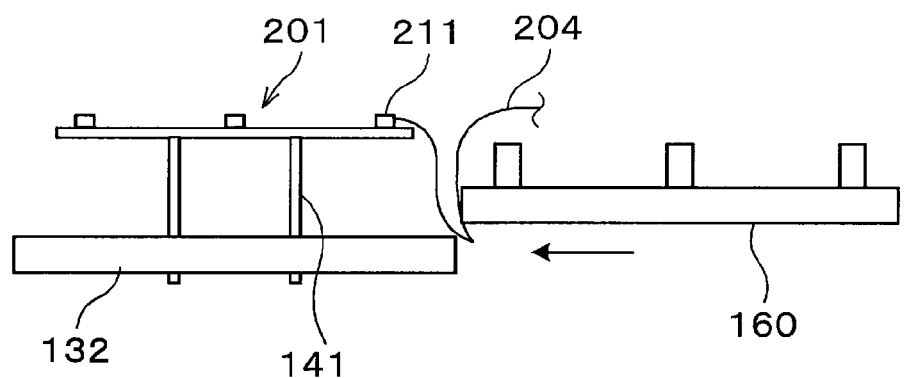
FIG. 15 is a view for describing the effect of the temperature measurement units in the example of FIGS. 11 and 12.

If the guide plate 301 having such a turner 314 is not used, as illustrated in FIG. 15, when the cooling plate 160 is inserted into the space between the measurement wafer 201 supported by the lifting pins 141 and the hot plate 132, the cable 204 hanging due to its own weight or the like may be rolled into the space between the cooling plate 160 and the hot plate 132. If rolled in this way, the cable 204 or other components of the temperature measurement unit 300 may be damaged, or the inside of the housing 120 of the heat treatment apparatus 40 may be contaminated.

Figure 16:
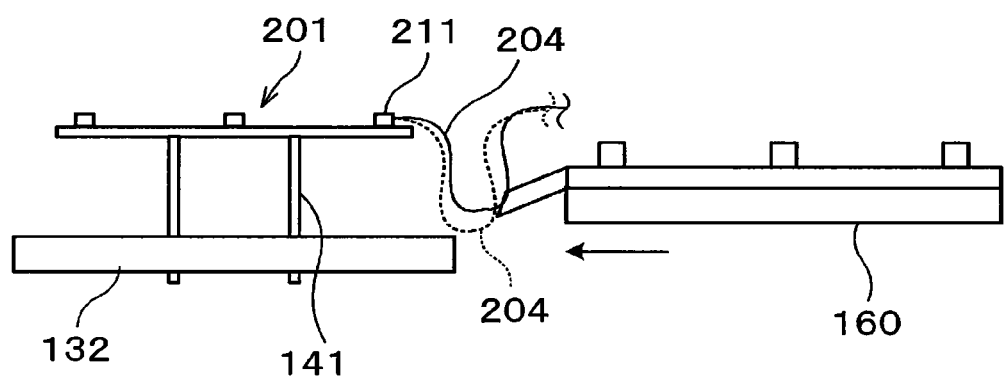
FIG. 16 is a view for describing the effect of the temperature measurement units in the example of FIGS. 11 and 12.

In contrast, when the guide plate 301 having the turner 314 is used as illustrated in FIG. 16, even if the cable 204 hangs down when the cooling plate 160 is inserted into the space between the measurement wafer 201 and the hot plate 132 (see the dotted line), the cable 204 rises along the slope 314a with the insertion of the cooling plate 160 (see the solid line). Therefore, the cable 204 is not rolled into the space between the cooling plate 160 and the hot plate 132. Therefore, it is possible to prevent the temperature measurement unit 300 from being damaged and the inside of the housing 120 of the heat treatment apparatus 40 from being contaminated due to the rolling-in of the cable 204.

In addition, the turner 314 is formed as follows. That is, the turner 314 is formed such that a lower end thereof is located above a bottom surface of the cooling plate 160 when the guide plate 301 is placed on the cooling plate 160. This makes it possible to prevent the turner 314 from colliding with the hot plate 132 or the like when the cooling plate 160 is moved to the heating area. In addition, the turner 314 is formed such that the lower end thereof is located below the top surface of the cooling plate 160 when the guide plate 301 is placed on the cooling plate 160. This makes it possible to more reliably prevent the cable 204 from being rolled into the space between the cooling plate 160 and the hot plate 132.

When the guide plate 301 is used, for example, by placing the guide plate 301 on which the measurement wafer 201 is placed on the cooling plate 160, the measurement wafer 201 is placed on the cooling plate 160, with the guide plate interposed therebetween.

The guide plate 301 may be provided with a grip portion to be gripped by, for example, an operator. By providing the grip portion in this way, it is possible for the operator to easily place the guide plate 301 on the cooling plate 160 from the wafer transfer area D through the opening F1 and the carry-in/out port 121.

It should be understood that the embodiments disclosed herein are illustrative and are not limited in all aspects. The embodiments described above may be omitted, replaced, or modified in various forms without departing from the scope and spirit of the appended claims.

According to the present disclosure, it is possible to provide a temperature measurement unit, a substrate processing apparatus, and a temperature measurement method capable of measuring, in a simulated manner, the temperature of a substrate when heated using a high-temperature hot plate.

While certain embodiments have been described, these embodiments have been presented by way of example only, and are not intended to limit the scope of the disclosures. Indeed, the embodiments described herein may be embodied in a variety of other forms. Furthermore, various omissions, substitutions, and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A temperature measurement unit comprising:
a measurement substrate on which a sensor configured to measure a temperature is mounted;
an information processor configured to acquire a result of detection by the sensor;
a cable connecting the sensor and the information processor to each other; and
a mounting member configured to install the information processor,
wherein the information processor is configured to be detachably installed on an installation part through the mounting member facing a heating area having a hot plate, with a cooling area interposed therebetween,
wherein the cable is configured to be able to follow movement of the measurement substrate when a cooling plate on which the measurement substrate is placed is moved from the cooling area to the heating area and the measurement substrate is placed on the hot plate in a state in which the information processor is installed on the installation part, and
wherein the mounting member includes a fixing portion to which the information processor is fixed and a hook portion engaged with the installation part and extending from an upper end of the fixing portion.

2. The temperature measurement unit of claim 1, wherein the installation part is a support member that extends in a direction orthogonal to a direction in which the cooling plate moves and is configured to support a heat treatment apparatus including the heating area and the cooling area.

3. The temperature measurement unit of claim 2, wherein the support member is a partition wall surrounding a substrate transport area provided with a substrate transport apparatus configured to transport a substrate, and includes an opening through which the substrate passes, and
the information processor is installed to be located in the substrate transport area.

4. The temperature measurement unit of claim 1, further comprising:
an intervening member positioned with respect to the cooling plate and placed on the cooling plate,
wherein the measurement substrate is placed on the cooling plate via the intervening member, and
the intervening member includes a guide configured to position the measurement substrate with respect to the intervening member.

5. The temperature measurement unit of claim 4, wherein the intervening member includes a plurality of convex portions configured to support the measurement substrate on a top surface thereof.

6. The temperature measurement unit of claim 4, wherein the intervening member is thinner than the cooling plate.

7. A temperature measurement unit comprising:
a measurement substrate on which a sensor configured to measure a temperature is mounted;
an information processor configured to acquire a result of detection by the sensor; and
a cable connecting the sensor and the information processor to each other,
wherein the information processor is configured to be detachably installed on an installation part facing a heating area having a hot plate, with a cooling area interposed therebetween,
wherein the cable is configured to be able to follow movement of the measurement substrate when a cooling plate on which the measurement substrate is placed is moved from the cooling area to the heating area and the measurement substrate is placed on the hot plate in a state in which the information processor is installed on the installation part,
wherein the temperature measurement unit further comprises an intervening member positioned with respect to the cooling plate and placed on the cooling plate,
wherein the measurement substrate is placed on the cooling plate via the intervening member,
wherein the intervening member includes a guide configured to position the measurement substrate with respect to the intervening member, and
wherein the intervening member includes a rolling-in prevention part configured to prevent the cable from being rolled into a space between the cooling plate and the hot plate when the cooling plate on which the intervening member is placed is inserted into a space between the measurement substrate and the hot plate located in the heating area.

8. A heat treatment apparatus for heat-treating a substrate, the heat treatment apparatus comprising:
a hot plate and a cooling plate; and
a temperature measurement unit,
wherein the temperature measurement unit comprises:
a measurement substrate on which a sensor configured to measure a temperature is mounted;
an information processor configured to acquire a result of detection by the sensor;
a cable connecting the sensor and the information processor to each other; and
a mounting member configured to install the information processor,
wherein the information processor is configured to be detachably installed on an installation part through the mounting member facing a heating area including the hot plate, with a cooling area interposed therebetween,
wherein the cable is configured to be able to follow movement of the measurement substrate when the cooling plate on which the measurement substrate is placed is moved from the cooling area to the heating area and the measurement substrate is placed on the hot plate in a state in which the information processor is installed on the installation part, and
wherein the mounting member includes a fixing portion to which the information processor is fixed and a hook portion engaged with the installation part and extending from an upper end of the fixing portion.

9. A method of measuring a temperature using a temperature measurement unit including a measurement substrate on which a sensor is mounted, an information processor configured to acquire a result of detection by the sensor, a cable connecting the sensor and the information processor to each other, and a mounting member configured to install the information processor and including a fixing portion and a hook portion extending from an upper end of the fixing portion,
wherein the method comprises:
installing the information processor on an installation part through the mounting member facing a heating area provided with a hot plate, with a cooling area interposed therebetween;
placing the measurement substrate on a cooling plate located in the cooling area;
delivering the measurement substrate to the hot plate by moving the measurement substrate to the heating area using the cooling plate; and
detecting the temperature using the sensor, and
wherein the installing the information processor includes fixing the fixing portion to the information processor and engaging the hook portion with the installation part.

10. The method of claim 9, further comprising:
returning the measurement substrate to the cooling plate; and
cooling the measurement substrate using the cooling plate.

11. The method of claim 10, further comprising:
removing the measurement substrate from the cooling plate located in the cooling area after cooling the measurement substrate.

* * * * *